(12) United States Patent
Zhang

(10) Patent No.: US 12,557,465 B2
(45) Date of Patent: Feb. 17, 2026

(54) PHOTOELECTRIC DEVICE

(71) Applicant: BOE Technology Group Co., Ltd., Beijing (CN)

(72) Inventor: Zhenqi Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 687 days.

(21) Appl. No.: 17/800,655

(22) PCT Filed: Oct. 22, 2021

(86) PCT No.: PCT/CN2021/125535
§ 371 (c)(1),
(2) Date: Aug. 18, 2022

(87) PCT Pub. No.: WO2022/134810
PCT Pub. Date: Jun. 30, 2022

(65) Prior Publication Data
US 2023/0102357 A1 Mar. 30, 2023

(30) Foreign Application Priority Data
Dec. 24, 2020 (CN) .......................... 202011547998.9

(51) Int. Cl.
*H10K 30/81* (2023.01)
*B82Y 30/00* (2011.01)
*H10K 30/50* (2023.01)
*H10K 50/115* (2023.01)
*H10K 50/17* (2023.01)
*H10K 50/81* (2023.01)
*H10K 85/10* (2023.01)
(Continued)

(52) U.S. Cl.
CPC .............. *H10K 30/81* (2023.02); *B82Y 30/00* (2013.01); *H10K 30/50* (2023.02); *H10K 50/115* (2023.02); *H10K 50/81* (2023.02); *H10K 85/1135* (2023.02); *H10K 85/40* (2023.02); *H10K 85/654* (2023.02); *H10K 50/17* (2023.02); *H10K 2102/102* (2023.02); *H10K 2102/103* (2023.02)

(58) Field of Classification Search
CPC ...... H10K 30/81; H10K 85/654; H10K 30/50; H10K 50/115; H10K 50/81; H10K 85/1135; H10K 85/40; H10K 50/17; H10K 2102/102; H10K 2102/103; B82Y 30/00
See application file for complete search history.

(56) References Cited

U.S. PATENT DOCUMENTS

2020/0373512 A1* 11/2020 Liang .................... H10K 85/20

* cited by examiner

*Primary Examiner* — Monica D Harrison
*Assistant Examiner* — Christopher A Culbert
(74) *Attorney, Agent, or Firm* — IPro, PLLC

(57) ABSTRACT

Provided in the present disclosure is a photoelectric device. For the photoelectric device, a modification layer is added on the surface of a first electrode layer on the side away from a base substrate. The presence of the modification layer can prevent the direct contact of the first electrode layer and other film layers, thereby alleviating the problem of corrosion of indium-containing oxide which constitutes the first electrode layer. Furthermore, an indium-ion trapping group contained in the modification layer can fix indium ions released after the corrosion of the indium-containing oxide to the surface of the first electrode layer, thereby preventing the indium ions from moving to the inner part of the photoelectric device, which can then increase the service life of the photoelectric device.

20 Claims, 5 Drawing Sheets

(51) Int. Cl.
*H10K 85/40* (2023.01)
*H10K 85/60* (2023.01)
*H10K 102/10* (2023.01)

PHOTOELECTRIC DEVICE

CROSS-REFERENCE OF RELATED APPLICATIONS

The application is a National Stage of International Application No. PCT/CN2021/125535, filed Oct. 22, 2021, which claims the priority of Chinese Patent Application No. 202011547998.9 filed on Dec. 24, 2020 to the China National Intellectual Property Administration and entitled "Photoelectric Device", the entire contents of which are incorporated herein by reference.

FIELD

The disclosure relates to the technical field of display, in particular a photoelectric device.

BACKGROUND

Germany's Bayer AG first synthesized a polythiophene derivative polyethylenedioxythiophene, namely PEDOT in 1988, and it uses 3,4-ethylenedioxythiophene (EDOT) as a monomer, and has the characteristics of high conductivity, good environmental stability, and the like, which has attracted extensive interest of scientists. PEDOT is an insoluble polymer, which limits its application. Subsequently, a PEDOT processing problem is solved by doping with a water-soluble polyelectrolyte polystyrene sulfonate (PSS), and the obtained PEDOT:PSS film has high conductivity, high mechanical strength, high visible light transmittance, superior stability, and the like. Hereafter, the field of application of PEDOT has been rapidly developed, and in particular, new materials, processes, elements and the like developed by using PEDOT as a substrate have been fully developed.

In photoelectric devices, PEDOT:PSS materials belong to very efficient hole injection materials. However, since PEDOT:PSS is acidic, it corrodes ITO in the photoelectric devices, and indium ions released after decomposition of the ITO enter the device, causing degradation of the performance and service life of the device.

SUMMARY

The embodiments of the disclosure provide a photoelectric device, including:
 a base substrate;
 a first electrode layer, disposed on a side of the base substrate, a material of the first electrode layer includes an indium-containing oxide; and
 a modification layer, disposed on a surface of the first electrode layer on a side facing away from the base substrate;
 the modification layer includes an indium-ion trapping group, a siloxane group, and a linking group linked between the indium-ion trapping group and the siloxane group, and the siloxane group is fixed to the surface of the first electrode layer.

In some embodiments, the indium-ion trapping group includes three pyridine groups.

In some embodiments, the siloxane group is generated by a reaction between a silane group linked to the linking group and a hydroxyl group present on the surface of the indium-containing oxide, and the silane group has a molecular formula of $Si-R_2R_3R_4$, where a $R_2$ group includes one of a methoxy group, an ethoxy group, a tert-butyl group, or chloride ion; a $R_3$ group includes one of the methoxy group, the ethoxy group, the tert-butyl group, or chloride ion; and a $R_4$ group includes one of the methoxy group, the ethoxy group, the tert-butyl group, or chloride ion.

In some embodiments, in the above photoelectric device provided by the embodiments of the disclosure, the $R_2$ group, the $R_3$ group and the $R_4$ group are the same.

In some embodiments, the $R_2$ group, the $R_3$ group and the $R_4$ group each is the methoxy group.

In some embodiments, the linking group includes one of an alkyl group or an aromatic group.

In some embodiments, the aromatic group includes at least one of a phenyl group, a naphthyl group or a thienyl group.

In some embodiments, a quantity of C atoms in a carbon chain of the linking group ranges from 6 to 10.

In some embodiments, a thickness of the modification layer ranges from 1 nm to 2 nm.

In some embodiments, the material of the first electrode layer includes one of an Indium-Tin Oxide, ITO or an Indium-Zinc Oxide, IZO.

In some embodiments, the photoelectric device further includes a hole injection layer disposed on a side of the first electrode layer facing away from the base substrate; where a material of the hole injection layer is acidic.

In some embodiments, the material of the hole injection layer includes PEDOT:PSS.

In some embodiments, the photoelectric device is a light-emitting device, and the photoelectric device further includes a light-emitting layer disposed on a side of the hole injection layer facing away from the modification layer.

In some embodiments, a material of the light-emitting layer is quantum dots or an organic substance.

In some embodiments, the photoelectric device is a photovoltaic device, and the photoelectric device further includes an active layer disposed on a side of the hole injection layer facing away from the modification layer.

DETAILED DESCRIPTION OF THE EMBODIMENTS

Figure 1:
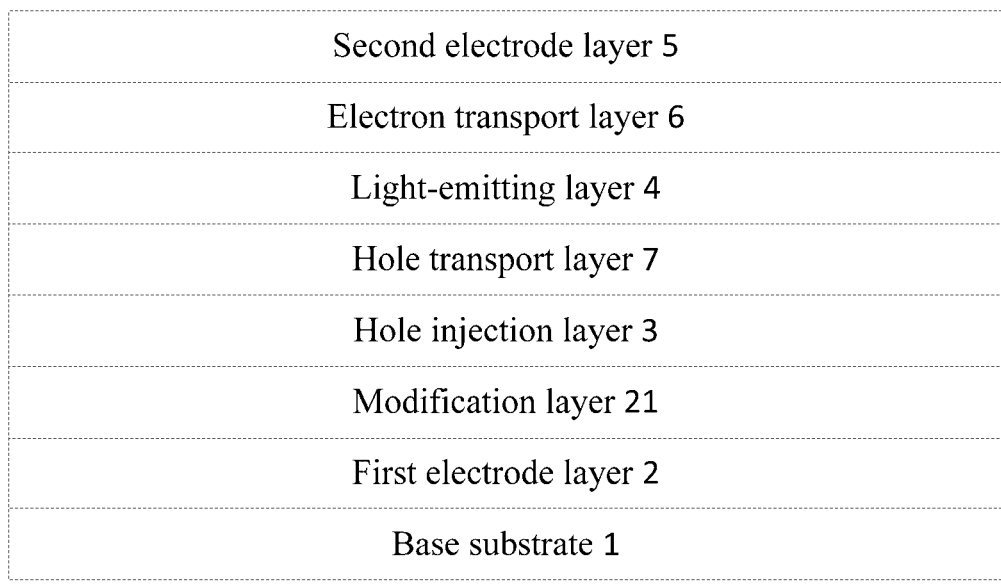
FIG. 1 is one structural schematic diagram of a photoelectric device provided by embodiments of the disclosure.

Currently, in a Quantum Dot, QD device, a most classical structure is: ITO/PEDOT:PSS/TFB/QD/ZnO/Al, and EQE of the device can reach 20% or above. However, since PEDOT:PSS is acidic, it corrodes ITO in the device, and indium ions released after decomposition of the ITO enter a light-emitting layer, causing degradation of the performance and service life of the device.

To replace a collocation of PEDOT:PSS/TFB, it has been proposed to employ an oxide as a hole injection layer, such as NiO, WOx, VOx, MoOx and the like. But since the energy level and mobility of the oxide are different from those of a PEDOT:PSS/TFB system, while the oxide may also quench QDs, final EQE of devices currently employing this solution is not high, and the highest EQE is 8.1% at present, with a device structure of ITO/NiO/Al$_2$O$_3$/QD/ZnO/Al. On the other hand, if PEDOT:PSS cannot be completely cancelled, another idea is to use a combination of an oxide and PEDOT:PSS, with the hope of separating PEDOT and ITO by the oxide for a better service life, but due to the matching problem of the energy level and mobility of an inorganic oxide, EQE is also not ideal when this solution is currently employed, and EQE of a device employing ITO/WO3 NPs/PEDOT:PSS/TFB/QD/ZnO/Al is the highest at present, which is 12.47%, and is still about twice less than EQE of a device employing PEDOT:PSS.

The photoelectric device provided by embodiments of the disclosure proposes a new concept of inserting a modification layer between PEDOT:PSS and ITO to alleviate corrosion of ITO by PEDOT:PSS and trap indium ions to improve the service life of the device without changing an original device structure. Moreover, since the modification layer can form a single molecular layer during manufacture, its thickness is extremely thin, which will not affect the carrier transport properties of the device itself, and thus does not affect the efficiency of the device.

To make the objects, technical solutions, and advantages of the disclosure clearer, the disclosure will be described in further detail below with reference to the accompanying drawings, and obviously, the described embodiments are only some, but not all, embodiments of the disclosure. Based on embodiments in the disclosure, all other embodiments obtained by those of ordinary skill in the art without inventive labor are within the scope of protection of the disclosure.

The shapes and sizes of components in the drawings do not reflect a true scale and are merely intended to illustrate the disclosure.

Figure 2:
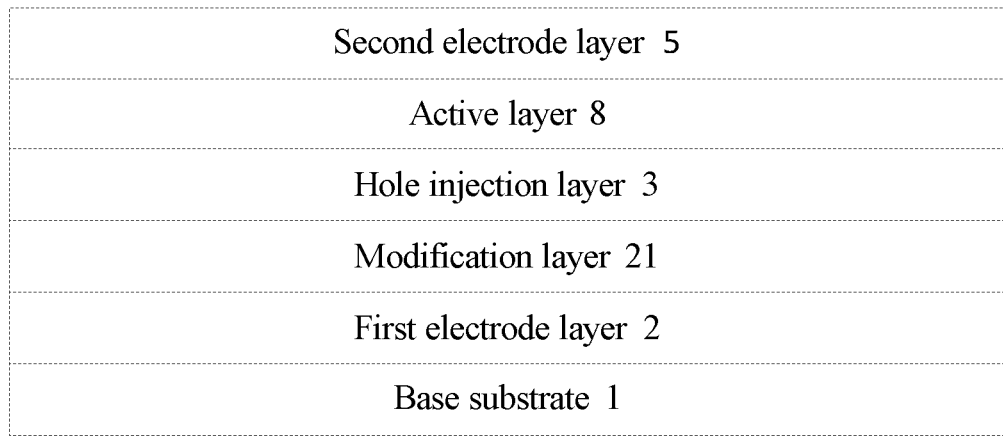
FIG. 2 is another structural schematic diagram of the photoelectric device provided by embodiments of the disclosure.

Embodiments of the disclosure provide a photoelectric device, as shown in FIGS. 1 and 2, including:

a base substrate 1;

a first electrode layer 2, disposed on a side of the base substrate 1, a material of the first electrode layer 2 includes an indium-containing oxide; and a modification layer 21, disposed on a surface of the first electrode layer 2 on a side facing away from the base substrate 1, the modification layer 21 includes an indium-ion trapping group X, a siloxane group, and a linking group R1 linked between the indium-ion trapping group X and the siloxane group, and the siloxane group is fixed to the surface of the first electrode layer 2.

In some embodiments, the modification layer 21 is added on the surface of the first electrode layer 2 on the side facing away from the base substrate 1, and the presence of the modification layer 21 can prevent the direct contact of the first electrode layer 2 and other film layers, thereby alleviating the problem of corrosion of the indium-containing oxide which constitutes the first electrode layer 2. Furthermore, the indium-ion trapping group X contained in the modification layer 21 can fix indium ions released after the corrosion of the indium-containing oxide to the surface of the first electrode layer 2, thereby preventing the indium ions from moving to the inner part of the photoelectric device, which can then increase the service life of the photoelectric device.

In some embodiments, the material of the first electrode layer 2 may include one of an Indium-Tin Oxide, ITO or an Indium-Zinc Oxide, IZO.

In some embodiments, as shown in FIGS. 1 and 2, the photoelectric device may further include a hole injection layer 3 disposed on a side, facing away from the base substrate 1, of the first electrode layer 2, a material of the hole injection layer 3 is acidic.

In some embodiments, the material of the hole injection layer 3 may include PEDOT:PSS. PEDOT:PSS is a mixture of two materials, PEDOT is a polymer of EDOT (a 3,4-ethylenedioxythiophene monomer), and PSS is polystyrene sulfonate, where PSS has a certain acidity.

In some embodiments, the hole injection layer 3, which is acidic in the device, corrodes the first electrode layer 2, and indium ions released after decomposition of the first electrode layer 2 enter the light-emitting layer, causing degradation of the performance and service life of the device. Therefore, the modification layer 21 is inserted between the hole injection layer 3 and the first electrode layer 2, and the presence of the modification layer 21 can prevent the direct contact of the first electrode layer 2 and the hole injection layer 3, thereby alleviating the problem of corrosion of the indium-containing oxide which constitutes the first electrode layer 2.

In some embodiments, the photoelectric device may be a light-emitting device, and in this case, as shown in FIG. 1, the photoelectric device may further include a light-emitting layer 4 disposed on a side, facing away from the modification layer 21, of the hole injection layer 3. Furthermore, as shown in FIG. 1, the photoelectric device may further include a second electrode layer 5, and an electron transport layer 6 disposed between the second electrode layer 5 and the light-emitting layer 4, and a hole transport layer 7 located between the light-emitting layer 4 and the hole injection layer 3.

In some embodiments, a material of the light-emitting layer 4 may be quantum dots QDs or an organic substance EL. When the light-emitting layer 4 is made of a quantum dot material, a material of the electron transport layer 6 may be ZnO, and a material of the hole transport layer 7 may be TFB. The second electrode layer 5 is typically a cathode layer, and may be made of Al.

In some embodiments, when the photoelectric device is the light-emitting device, the light-emitting device can be applied to a display device, and the display device can be any product or component having a display function, such as a mobile phone, a tablet computer, a television, a display, a laptop computer, a digital photo frame, a navigator, and the like.

In some embodiments, the photoelectric device may also be a photovoltaic device, and in this case, as shown in FIG. 2, the photoelectric device may further include an active layer 8 disposed on a side, facing away from the modification layer 21, of the hole injection layer 3, and a material of the active layer 8 may be PBDT-DTNT:PC71BM. Furthermore, as shown in FIG. 2, the photoelectric device may further include a second electrode layer 5 disposed on one side, facing away from the hole injection layer 3, of the active layer 8, and a material of the second electrode layer 5 may be Al.

In some embodiments, when the photoelectric device is the photovoltaic device, the photovoltaic device may be applied to solar cells.

Furthermore, the photoelectric device provided by embodiments of the disclosure may also be other devices that include a structure in which ITO and PEDOT:PSS are in direct contact, each of which may increase the service life of the device by adding a modification layer between ITO and PEDOT:PSS.

Figure 3:
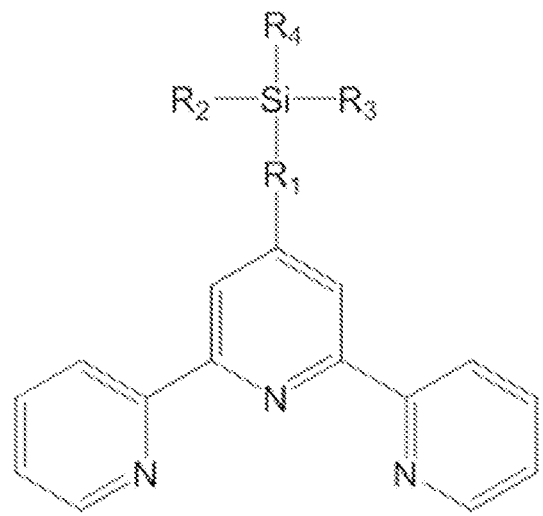
FIG. 3 is a general structural formula of a modification material in the photoelectric device provided by embodiments of the disclosure.

In some embodiments, the modification layer 21 is generated by a reaction between a modification material and a hydroxyl group on the surface of the first electrode layer 2. In some embodiments, the siloxane group in the modification layer 21 is generated by a reaction between the silane group Si—$R_2R_3R_4$ linked to the linking group $R_1$ and the hydroxyl group present on the surface of the indium-containing oxide. As shown in FIG. 3, the modification material includes an indium-ion trapping group X, a silane group Si—$R_2R_3R_4$, and a linking group $R_1$ linked between the indium-ion trapping group X and the silane group Si—$R_2R_3R_4$, with a general formula of X—$R_1$—Si—$R_2R_3R_4$, where X is the indium-ion trapping group, $R_1$ is the linking group, and Si—$R_2R_3R_4$ is the silane group.

Figure 4:
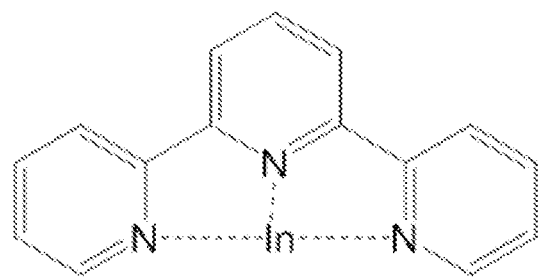
FIG. 4 is a schematic diagram of a principle of trapping indium ions by an indium-ion trapping group of the modification material in the photoelectric device provided by embodiments of the disclosure.

In some embodiments, the indium-ion trapping group X may include three pyridine groups, as shown in FIG. 3, and N atoms on the three pyridine rings may bind to indium ions, as shown in FIG. 4, the diffused indium ions are fixed to the surface of the first electrode layer 2, preventing the indium ions from entering the device and affecting the efficiency and service life of the device.

In some embodiments, the silane group has a molecular formula of $SiR_2R_3R_4$, a R2 group includes one of a methoxy group, an ethoxy group, a tert-butyl group, or chloride ion; a R3 group includes one of the methoxy group, the ethoxy group, the tert-butyl group, or chloride ion; and a R4 group includes one of the methoxy group, the ethoxy group, the tert-butyl group, or chloride ion.

In some embodiments, the role of the silane group Si—$R_2R_3R_4$ is to react with a hydroxyl group on the surface of the first electrode layer 2 after hydrolysis, fixing the modification layer 21 to the surface of the first electrode layer 2.

In some embodiments, the $R_2$ group, the $R_3$ group, and the $R_4$ group of the silane group may be a same group or may be different groups, if the $R_2$ group, the $R_3$ group, and the $R_4$ group are different groups, the different groups may differ in their hydrolysis rate and solubility. The arrangement of the $R_2$ group, $R_3$ group, and $R_4$ group in the silane group is not required.

Figure 5:
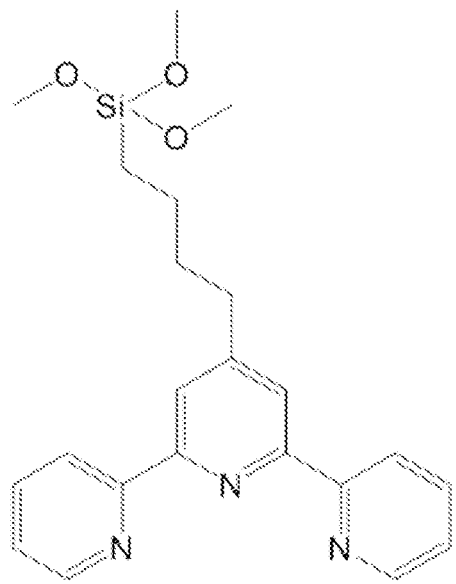
FIG. 5 is a specific molecular structure of the modification material in the photoelectric device provided by embodiments of the disclosure.

In some embodiments, the $R_2$ group, the $R_3$ group, and the $R_4$ group each is the methoxy group (OMe, Me is methyl), and a molecular structure of the modification material is shown in FIG. 5.

Figure 6:
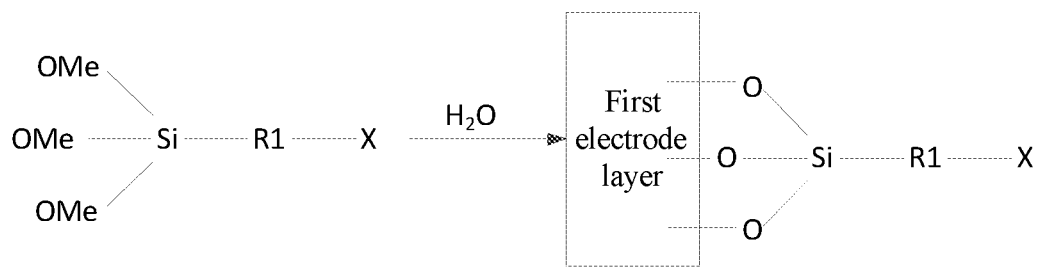
FIG. 6 is a schematic diagram of a principle of action of a modification layer and a first electrode layer in the photoelectric device provided by embodiments of the disclosure.

In some embodiments, by taking $R_2=R_3=R_4=OMe$ as an example, a hydrolysis mechanism of the modification material is: the modification material is heated to be hydrolyzed into silanol, i.e., X—$R_1$—Si(OMe)$_3$→X—$R_1$—Si(OH)$_3$, and silanol Si(OH)$_3$ can react with hydroxyl group on the surface of the first electrode layer 2 to become siloxane, thereby being tightly connected with the first electrode layer 2 together, as shown in FIG. 6.

In some embodiments, the linking group $R_1$ can be an alkyl group, an aromatic group, or the like, and in FIG. 5, the linking group R1 is an alkyl group as an example for illustration.

In some embodiments, the alkyl group may include methyl, ethyl, propyl or the like, and the aromatic group is a group containing a conjugated unit, and may include phenyl group, naphthyl group, thienyl group, and the like.

In some embodiments, the linking group $R_1$ has two functions, one function is a linking function to link the indium-ion trapping group X to the silane group Si—$R_2R_3R_4$; and the other function is a separation function to increase a distance between the first electrode layer 2 and the hole injection layer 3, alleviating the corrosive effect of PEDOT:PSS on ITO.

In some embodiments, the longer the length of the linking group $R_1$, the thicker the thickness of the modification layer 21 composed of the modification material, the farther the hole injection layer 3 is from the first electrode layer 2 and the weaker the corrosion effect, but if the thickness of the modification layer 21 is too thick, carrier transport will be affected.

In some embodiments, a quantity of C atoms in a carbon chain of the linking group $R_1$ ranges from 6 to 10. At present, quantum dot ligands mainly applied to QLED devices are mainly octanethiol and dodecanethiol, and when the number of the C atoms is 6-10, the overall thickness of the modification layer 21 is about 1 nm, which will not affect the carrier transport while minimizing the corrosion effect of the hole injection layer on the first electrode layer.

In some embodiments, since the modification layer 21 is formed on the surface of the first electrode layer 2 in a manner of reacting with the hydroxyl group on the surface of the first electrode layer 2 after the modification material is hydrolyzed, it is ensured that the modification layer 21 consists of a single layer of molecules. The thickness of the modification layer 21 is one molecular length of the modification material, and varies depending on the molecular length, and the thickness of the modification layer 21 ranges from 1 nm to 2 nm.

Figure 7:
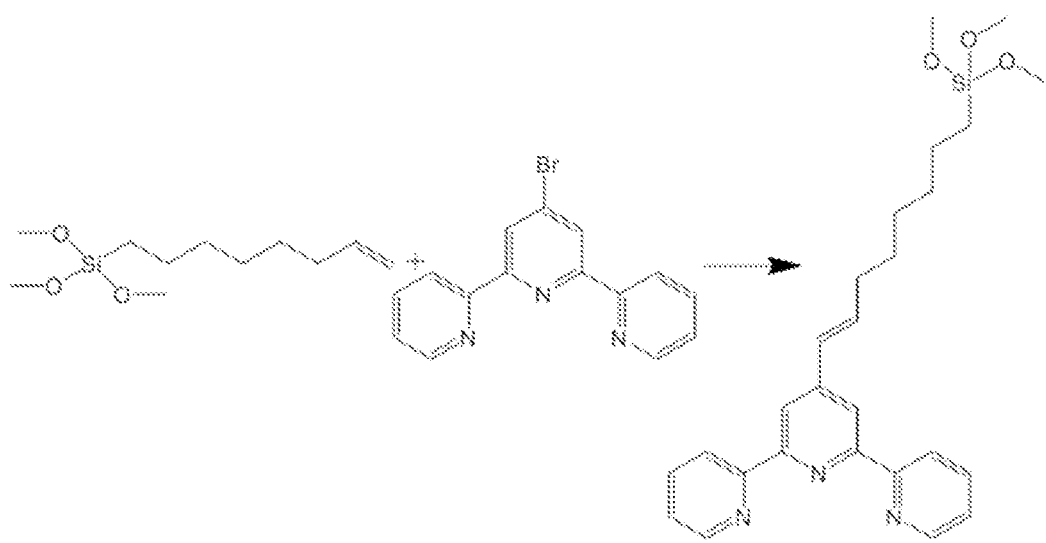
FIG. 7 is a chemical reaction formula for preparing the modification material in the photoelectric device provided by embodiments of the disclosure.

In some embodiments, the modification material can be prepared by dissolving 2 g of trimethoxy(7-octen-1-yl)silane and 1.5 g of 4'-bromo-2,2':6',2''-terpyridine in 50 mL of dry toluene, adding tetrakis(triphenylphosphine)palladium in a catalyst amount, and refluxing for 10 hours under the protection of nitrogen; and after completion of the reaction, spin-drying the resulting product, and purifying the product by column chromatography (hexane:ethyl acetate=3:1) to finally obtain the molecule, with a specific reaction formula shown in FIG. 7.

Based on the same inventive concept, embodiments of the disclosure also provide a method for manufacturing the above photoelectric device, since the principle of this manufacturing method for solving the problem is similar to that of the above photoelectric device, the implementation of this manufacturing method can refer to the implementation of the photoelectric device, and the repetition will not be repeated.

Figure 8:
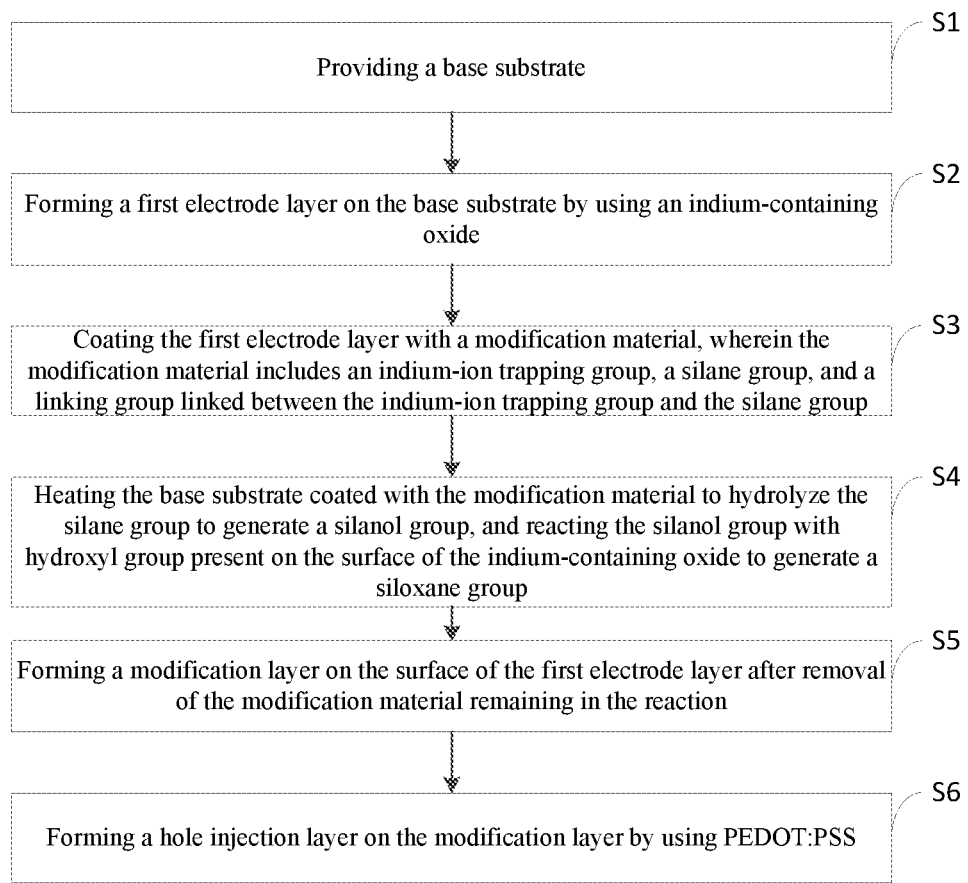
FIG. 8 is a schematic flow chart of a method for manufacturing the photoelectric device provided by embodiments of the disclosure.

Embodiments of the disclosure provide a method for manufacturing a photoelectric device, as shown in FIG. 8, including:
S1, providing a base substrate;
S2, forming a first electrode layer on the base substrate by using an indium-containing oxide;
S3, coating the first electrode layer with a modification material, the modification material includes an indium-ion trapping group, a silane group, and a linking group linked between the indium-ion trapping group and the silane group;

S4, heating the base substrate coated with the modification material to hydrolyze the silane group to generate a silanol group, and reacting the silanol group with hydroxyl group present on the surface of the indium-containing oxide to generate a siloxane group; and S5, forming a modification layer on the surface of the first electrode layer after removal of the modification material remaining in the reaction.

In some embodiments, as shown in FIG. 8, the method further includes:

S6, forming a hole injection layer on the modification layer by using PEDOT:PSS.

In some embodiments, after manufacture of the hole injection layer is completed, other film layers may also be manufactured as necessary, for example, by taking a structure of a quantum dot light-emitting device shown in FIG. 1 as an example, the above-mentioned manufacturing method provided by the embodiments of the disclosure will be described in detail. In particular, a manufacturing process is as follows.

1) an ITO substrate is ultrasonically cleaned for 10 min in deionized water, ethanol, and acetone sequentially.
2) The ITO substrate is cleaned in an oxygen plasma cleaner for 10 min before use.
3) The ITO substrate is spin-coated with a solution of the modification material at a rate of 4000 r/min.
4) The ITO substrate is placed on a hot stage and heated at 80° C. for 10 min to react the silane group of the modification material with the hydroxyl group of the surface of ITO.
5) The ITO substrate is rinsed with n-hexane to wash away the solution of the modification material which is unreacted.
6) The ITO substrate is placed on a hot stage and heated at 80° C. for 10 min to remove a solvent in the solution of the modification material to form a modification layer.
7) The ITO substrate with the modification layer is spin-coated with a PEDOT:PSS solution at a rate of 4000 r/min in air, followed by dry annealing at a high temperature of 150° C. for 20 min to obtain a hole injection layer.
8) The ITO substrate is transferred into a glove box filled with nitrogen, and then spin coated with a TFB solution at a rate of 2000 r/min, followed by dry annealing at a high temperature of 120° C. for 20 min to obtain a hole transport layer.
9) The ITO substrate is spin-coated with a quantum dot solution at a rate of 2000 r/min, followed by dry annealing at a high temperature of 120° C. for 20 min to obtain a light-emitting layer.
10) The ITO substrate is spin-coated with a zinc oxide solution at a rate of 2000 r/min, followed by dry annealing at a high temperature 120° C. for 20 min to obtain an electron transport layer.
11) An aluminum electrode is deposited in an evaporation apparatus by using a metal mask under a high vacuum of $5\times10^{-4}$ Pa to obtain a second electrode layer.

According to the photoelectric device provided by embodiments of the disclosure, the modification layer is added to the surface of the first electrode layer on the side facing away from the base substrate. The presence of the modification layer can prevent the direct contact of the first electrode layer and other film layers, thereby alleviating the problem of corrosion of the indium-containing oxide which constitutes the first electrode layer. Furthermore, the indium-ion trapping group contained in the modification layer can fix indium ions released after the corrosion of the indium-containing oxide to the surface of the first electrode layer, thereby preventing the indium ions from moving to the inner part of the photoelectric device, which can then increase the service life of the photoelectric device.

Obviously, those skilled in the art can make various changes and modifications to the disclosure without departing from the spirit and scope of the disclosure. Thus, if these changes and modifications of the disclosure fall within the scope of the claims of the disclosure and their equivalents, the disclosure is also intended to include these changes and modifications.

What is claimed is:

1. A photoelectric device, comprising:
a base substrate;
a first electrode layer, disposed on a side of the base substrate, wherein a material of the first electrode layer comprises an indium-containing oxide; and
a modification layer, disposed on a surface of the first electrode layer on a side facing away from the base substrate;
wherein the modification layer comprises an indium-ion trapping group, a siloxane group, and a linking group linked between the indium-ion trapping group and the siloxane group, and the siloxane group is fixed to the surface of the first electrode layer.

2. The photoelectric device of claim 1, wherein the indium-ion trapping group comprises three pyridine groups.

3. The photoelectric device of claim 1, wherein the siloxane group is generated by a reaction between a silane group linked to the linking group and a hydroxyl group present on the surface of the indium-containing oxide; and
the silane group has a molecular formula of $Si—R_2R_3R_4$;
wherein
a $R_2$ group comprises one of a methoxy group, an ethoxy group, a tert-butyl group, or chloride ion; a $R_3$ group comprises one of the methoxy group, the ethoxy group, the tert-butyl group, or chloride ion; and a $R_4$ group comprises one of the methoxy group, the ethoxy group, the tert-butyl group, or chloride ion.

4. The photoelectric device of claim 3, wherein the $R_2$ group, the $R_3$ group, and the $R_4$ group are the same.

5. The photoelectric device of claim 4, wherein the $R_2$ group, the $R_3$ group, and the $R_4$ group each is the methoxy group.

6. The photoelectric device of claim 1, wherein the linking group comprises one of an alkyl group or an aromatic group.

7. The photoelectric device of claim 6, wherein the aromatic group comprises at least one of a phenyl group, a naphthyl group or a thienyl group.

8. The photoelectric device according to claim 6, wherein a quantity of C atoms in a carbon chain of the linking group ranges from 6 to 10.

9. The photoelectric device of claim 1, wherein a thickness of the modification layer ranges from 1 nm to 2 nm.

10. The photoelectric device of claim 1, wherein the material of the first electrode layer comprises one of an Indium-Tin Oxide, ITO or an Indium-Zinc Oxide, IZO.

11. The photoelectric device of claim 1, further comprising:
a hole injection layer, disposed on a side of the first electrode layer facing away from the base substrate;
wherein a material of the hole injection layer is acidic.

12. The photoelectric device of claim 11, wherein the material of the hole injection layer comprises PEDOT: PSS.

13. The photoelectric device of claim 11, wherein the photoelectric device is a light-emitting device; and the photoelectric device further comprises: a light-emitting layer disposed on a side of the hole injection layer facing away from the modification layer.

14. The photoelectric device of claim 13 wherein a material of the light-emitting layer is quantum dots or an organic substance.

15. The photoelectric device of claim 11, wherein the photoelectric device is a photovoltaic device; and the photoelectric device further comprises: an active layer disposed on a side of the hole injection layer facing away from the modification layer.

16. The photoelectric device of claim 15, further comprising:

a second electrode layer disposed on a side of the active layer facing away from the hole injection layer.

17. The photoelectric device of claim 6, wherein the alkyl group comprises one of a methyl group, an ethyl group or a propyl group.

18. A display device, comprising the photoelectric device of claim 1.

19. A manufacturing method of the photoelectric device of claim 1, comprising:

providing the base substrate;

forming the first electrode layer on the base substrate by using the indium-containing oxide;

coating the first electrode layer with a modification material, wherein the modification material comprises an indium-ion trapping group, a silane group, and a linking group linked between the indium-ion trapping group and the silane group;

heating the base substrate coated with the modification material to hydrolyze the silane group to generate a silanol group, and reacting the silanol group with the hydroxyl group present on the surface of the indium-containing oxide to generate a siloxane group; and forming the modification layer on the surface of the first electrode layer after removal of the modification material remaining in the reaction.

20. The manufacturing method of the photoelectric device of claim 19, further comprising:

forming a hole injection layer on the modification layer by using PEDOT: PSS.

* * * * *